(12) United States Patent
Krounbi et al.

(10) Patent No.: US 10,164,175 B2
(45) Date of Patent: Dec. 25, 2018

(54) METHOD AND SYSTEM FOR PROVIDING A MAGNETIC JUNCTION USABLE IN SPIN TRANSFER TORQUE APPLICATIONS USING MULTIPLE STACK DEPOSITIONS

(71) Applicant: Samsung Electronics Co., LTD., Gyeonggi-do (KR)

(72) Inventors: Mohamad Towfik Krounbi, San Jose, CA (US); Dustin William Erickson, Morgan Hill, CA (US); Xueti Tang, Fremont, CA (US); Donkoun Lee, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 48 days.

(21) Appl. No.: 15/177,159

(22) Filed: Jun. 8, 2016

(65) Prior Publication Data

US 2017/0256708 A1 Sep. 7, 2017

Related U.S. Application Data

(60) Provisional application No. 62/304,924, filed on Mar. 7, 2016.

(51) Int. Cl.
*H01L 27/22* (2006.01)
*H01L 43/12* (2006.01)
(Continued)

(52) U.S. Cl.
CPC ............ *H01L 43/12* (2013.01); *H01L 27/222* (2013.01); *H01L 43/02* (2013.01); *H01L 43/08* (2013.01); *H01L 43/10* (2013.01)

(58) Field of Classification Search
CPC ...... H01L 43/08; H01L 27/222–27/228; H01L 43/02; H01L 43/12; H01L 29/82; H01L 43/00–43/14; G11C 11/14–11/1697; G11C 11/5607; G11C 14/0036; G11C 14/0045; G11C 14/0081; G11C 19/02–19/10; G11C 19/14;
(Continued)

(56) References Cited

U.S. PATENT DOCUMENTS 7,470,374 B2 12/2008 Hattori et al.
8,008,095 B2 * 8/2011 Assefa .................... H01L 43/12
365/164

(Continued)

*Primary Examiner* — William F Kraig
*Assistant Examiner* — Khatib Rahman
(74) *Attorney, Agent, or Firm* — Van Pelt, Yi & James LLP (57) ABSTRACT

A method for providing magnetic junctions is described. Each magnetic junction includes a free layer. A first portion of a stack for the magnetic junctions is provided. The first portion of a stack includes magnetic layer(s) for the free layer. A hard mask is provided. The hard mask covers a part of the first portion of the stack corresponding to the magnetic junctions. The hard mask includes aperture(s) exposing a second part of the first portion of the stack corresponding to spacing(s) between the magnetic junctions. The spacing(s) are not more than fifty nanometers. The second part of the first portion of the stack is etched. A remaining part of the first portion of the stack forms a first portion of each magnetic junction. This first portion of each magnetic junction includes the free layer. A second portion of the stack for the magnetic junctions is also provided.

14 Claims, 8 Drawing Sheets

(51) Int. Cl.
*H01L 43/02* (2006.01)
*H01L 43/08* (2006.01)
*H01L 43/10* (2006.01)

(58) Field of Classification Search
CPC .... G11C 2211/5615–2211/5616; G11C 11/15; G11C 19/08; H01F 41/303; H01F 10/324–10/3295
See application file for complete search history.

(56) References Cited

U.S. PATENT DOCUMENTS

| | | | |
|---|---|---|---|
| 8,372,661 B2 | 2/2013 | Horng | |
| 8,617,408 B2 | 12/2013 | Balamane | |
| 8,993,352 B2 | 3/2015 | Nishimura | |
| 9,246,082 B2* | 1/2016 | Tokashiki | G11C 11/161 |
| 9,570,509 B2* | 2/2017 | Machkaoutsan | H01L 43/08 |
| 2003/0210586 A1* | 11/2003 | Nakajima | B82Y 10/00 |
| | | | 365/200 |
| 2010/0200900 A1* | 8/2010 | Iwayama | B82Y 25/00 |
| | | | 257/295 |
| 2013/0250666 A1* | 9/2013 | Shimomura | G11C 11/16 |
| | | | 365/158 |
| 2014/0286084 A1* | 9/2014 | Watanabe | G11C 11/161 |
| | | | 365/158 |
| 2015/0041933 A1* | 2/2015 | Chepulskyy | H01F 10/3254 |
| | | | 257/421 |
| 2015/0061053 A1* | 3/2015 | Nakayama | H01L 43/10 |
| | | | 257/421 |
| 2015/0311901 A1* | 10/2015 | Bromberg | H01L 43/08 |
| | | | 326/38 |

* cited by examiner

METHOD AND SYSTEM FOR PROVIDING A MAGNETIC JUNCTION USABLE IN SPIN TRANSFER TORQUE APPLICATIONS USING MULTIPLE STACK DEPOSITIONS

CROSS-REFERENCE TO RELATED APPLICATIONS

This application claims the benefit of provisional Patent Application Ser. No. 62/304,924, filed Mar. 7, 2016, entitled MTJ DOUBLE PATTERNING PROCESS FOR ULTRA-HIGH SPEED AND DENSITY OF SPINTRONICS DEVICES, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The conventional MTJ includes at least a conventional pinned layer, a conventional free layer and a conventional nonmagnetic tunneling barrier layer between the conventional pinned and free layers. A bottom contact below the conventional MTJ and a top contact on the conventional MTJ may be used to drive current through the conventional MTJ in a current-perpendicular-to-plane (CPP) direction. The conventional pinned layer and the conventional free layer are magnetic. The magnetization of the conventional pinned layer is fixed, or pinned, in a particular direction. The conventional free layer has a changeable magnetization.

To switch the magnetization of the conventional free layer, a current is driven through the MTJ perpendicular to plane. When a sufficient current is driven from the top contact to the bottom contact, the magnetization of the conventional free layer may switch to be in one direction with respect to the magnetization of a conventional bottom pinned layer. When a sufficient current is driven from the bottom contact to the top contact, the magnetization of the free layer may switch to be in the opposite direction with respect to the magnetization of the bottom pinned layer. The differences in magnetic configurations correspond to different magnetoresistances and thus different logical states of the conventional MTJ.

To fabricate conventional MTJs, a stack of layers is typically provided. This stack includes any seed layer(s), the pinned layer, the nonmagnetic spacer layer, the free layer and capping layer(s). In the case of a dual MTJ, the stack also includes the additional nonmagnetic spacer layer and pinned layer. These layers are full film deposited on the substrate. A mask covering regions of the substrate on which the MTJs are to be formed is provided. The stack is then etched to define the magnetic junction. Fabrication of the magnetic device may be completed, for example by refilling the region between the MTJs and providing electrical contact to the MTJs.

The current trend in memory technology is to higher recording densities. To increase the areal density of magnetic memories, MTJs are spaced closer together. For example, the height of the MTJ stack may be on the order of the distance between stack. As a result, fabrication of MTJs at higher densities may be challenging. Accordingly, what is needed is a method and system that may extend the spin transfer torque based memories to higher densities. The method and system described herein address such a need.

BRIEF SUMMARY OF THE INVENTION

A method for providing magnetic junctions is described. Each magnetic junction includes a free layer. A first portion of a stack for the magnetic junctions is provided. The first portion of a stack includes magnetic layer(s) for the free layer. A hard mask is provided on the first portion of the stack. The hard mask covers a part of the first portion of the stack corresponding to the magnetic junctions. The hard mask includes aperture(s) exposing a second part of the first portion of the stack corresponding to spacing(s) between the magnetic junctions. The spacing(s) are not more than fifty nanometers. The second part of the first portion of the stack is etched. A remaining part of the first portion of the stack forms a first portion of each magnetic junction. This first portion of each magnetic junction includes the free layer. A second portion of the stack for the magnetic junctions is also provided.

DETAILED DESCRIPTION OF THE INVENTION

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A method for providing magnetic junctions is described. Each magnetic junction includes a free layer. A first portion of a stack for the magnetic junctions is provided. The first portion of a stack includes magnetic layer(s) for the free layer. A hard mask is provided on the first portion of the stack. The hard mask covers a part of the first portion of the stack corresponding to the magnetic junctions. The hard mask includes aperture(s) exposing a second part of the first portion of the stack corresponding to spacing(s) between the magnetic junctions. The spacing(s) are not more than fifty nanometers. The second part of the first portion of the stack is etched. A remaining part of the first portion of the stack forms a first portion of each magnetic junction. This first portion of each magnetic junction includes the free layer. A second portion of the stack for the magnetic junctions is also provided.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 1:
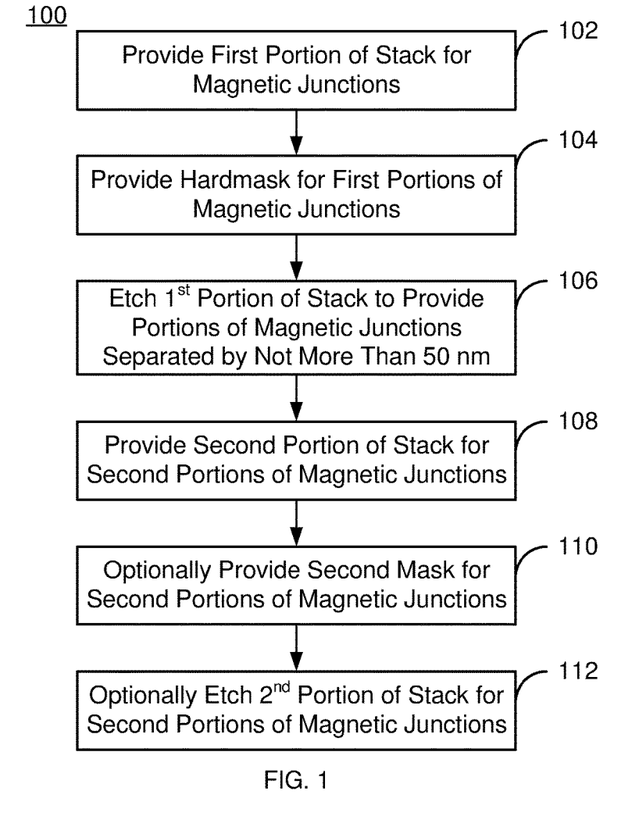
FIG. 1 is a flow chart depicting an exemplary embodiment of a method for providing magnetic junctions usable in a magnetic devices such as a magnetic memory programmable using spin transfer torque.

FIG. 1 is a flow chart depicting an exemplary embodiment of a method 100 for providing magnetic junctions usable in a magnetic devices such as a spin transfer torque magnetic random access memory (STT-MRAM) and, therefore, in a variety of electronic devices. For simplicity, some steps may be omitted, performed in another order, include substeps and/or combined. Further, the method 100 may start after other steps in forming a magnetic memory have been performed. FIGS. 2-5 depict an exemplary embodiment of a magnetic device 200 that may be fabricated using the method 100. FIGS. 2-5 are not to scale and only a portion of the magnetic device 200 is shown. Referring to FIGS. 1-5, the method 100 is described in the context of the magnetic device 200. However, other magnetic junctions and/or other devices may be formed. In addition, the components shown may include subcomponents. Further, multiple magnetic devices may be simultaneously fabricated. As used herein, a stack for magnetic junctions includes at least all of the magnetic layers used in forming the magnetic junction. Thus, a stack includes at least a pinned layer, a nonmagnetic spacer layer and a free layer. If dual magnetic junctions are formed, then the stack also includes an additional nonmagnetic spacer layer and an additional pinned layer. However, these layers of the stack have not been defined to form individual magnetic junctions. Instead, the layers of the stack cover regions between locations where the magnetic junctions will reside. For example, the stack covers some or all of the substrate on which the magnetic junctions are being fabricated.

A first portion of a stack for the magnetic junctions is provided, via step 102. This portion of the stack includes at least the magnetic layer(s) for the free layer. Seed layer(s) may also be provided as part of step 102. If the magnetic junctions being formed are dual magnetic junctions, then the layers for the bottom pinned layer and bottom nonmagnetic spacer layer are also provided in step 102. In some embodiments, step 102 also includes providing at least part of the layers for the nonmagnetic spacer layer. However, the upper portion of the stack is not provided in step 102. Thus, at least one pinned layer for the magnetic junctions being formed is not part of the stack deposited in step 102.

In some cases, the magnetic junctions being formed are MTJs. Thus, the nonmagnetic spacer layer is a tunneling barrier layer, such as crystalline MgO. In such a case, an MgO layer may be provided as part of step 102. In other embodiments a metallic layer, such as Mg may be formed. Such a layer may be oxidized later to form at least part of the tunneling barrier layer. In other embodiments, such a layer may be removed.

Step 102 may also include providing an adhesion layer for the hard mask, described below. Such an adhesion layer may include at least one of Mg, MgTi, MgAl, Ti and Ta. In some embodiments, an Mg layer is used. In such an embodiment, the Mg adhesion layer may not only be used to facilitate the formation of the hard mask, but also form part of the tunneling barrier layer. The adhesion layer is desired to be thin. Thus, the thickness of the adhesion layer is less than ten Angstroms. In some embodiments, the adhesion layer is less than five Angstroms thick, but greater than zero Angstroms thick.

A hard mask is provided on the first portion of the stack, via step 104. The hard mask has a high selectivity for the underlying layers of the first portion of the stack. Stated differently, the hard mask is removed significantly more slowly than the first portion of the stack using the etch(es) described below. In some embodiments, the selectivity is at least two (first portion of the stack removed twice as fast as the hard mask). In some embodiments, the etch selectivity is at least three. In addition, the hard mask is desired to be removable from the underlying layers after its function is completed. In some embodiments, therefore, the hard mask is desired to be removed via a reactive ion etch (RIE). For example, the hard mask may be a carbon hard mask. A carbon hard mask is removable via an oxygen RIE and has the requisite selectivity with the layers of the first portion of the stack. In other embodiments, other material(s) fulfilling the criteria above may be used.

Step 104 may include depositing a hard mask layer, forming a photoresist mask on the hard mask and then patterning the hard mask layer. The resulting hard mask covers the part of the first portion of the stack corresponding to the magnetic junctions being formed. The hard mask includes apertures exposing another part of the first portion of the stack corresponding to the spacing(s) between the magnetic junctions. As used herein, a spacing is the distance between the magnetic junctions from center-to-center. In other words, the spacing corresponds to the pitch of the magnetic junctions. The spacing is not the distance between edges of the magnetic junctions.

Figure 2:
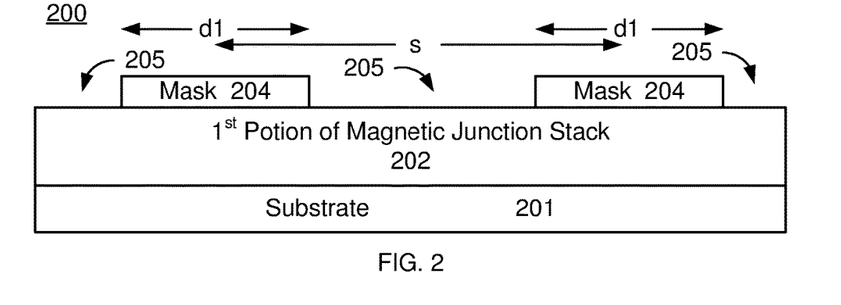
FIGS. 2-5 depict an exemplary embodiment of a magnetic device, such as a magnetic memory programmable using spin transfer torque, during fabrication using multiple etches for the magnetic junctions.

FIG. 2 depicts the magnetic device 200 after step 104 is completed. Thus, a substrate 201 and first portion of the stack 202 are shown. The substrate 201 may include various structures fabricated prior to the magnetic junctions. For example, selection devices, electrical contacts and lines may be present. The hard mask 204 is also shown. As can be seen in FIG. 2, the hard mask 204 includes apertures 205 that set the spacing, s, between the magnetic junctions being formed. The spacing, s, is not more than fifty nanometers. In some embodiments, the spacing is not more than forty nanometers. In some cases, the spacing may be even smaller. In addition, the hard mask 204 sets the lateral dimension d1 of the first portion of the magnetic junctions being formed. The lateral dimension d1 does not exceed twenty nanometers in some embodiments. In some embodiments, the lateral dimension does not exceed fifteen nanometers. In other embodiments, the lateral dimension may differ. However, the lateral dimension is less than half of the spacing.

The first portion of the stack 202 is etched, via step 106. Step 106 may include performing an ion beam etch (IBE). In other embodiments, another etch including but not limited to an RIE might be performed. Multiple etches might also be performed. For example, multiple IBEs, multiple RIEs (for example having different etch chemistries) or a combination of IBEs and RIEs may be utilized in step 106. A remaining part of the first portion of the stack 202 forms a first portion of each of the magnetic junctions.

Figure 3:
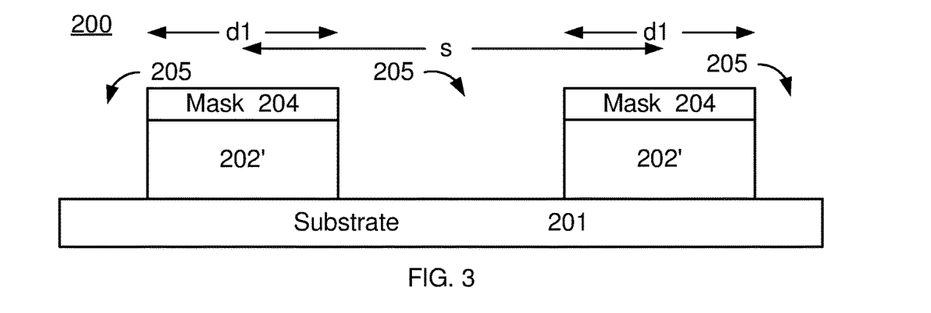

FIG. 3 depicts the magnetic device 200 after the first portion of the stack 202 has been etched in step 106. The regions of the first portion of the stack 202 under the apertures 205 have been removed by the etch. The remaining parts of the first portion of the stack form a first portion 202' of each magnetic junction. The first portion 202' of the magnetic junction includes the free layer for the magnetic junction. The lateral dimension for the first portion 202' of the magnetic junction is substantially the same as the lateral dimension for the hard mask 202, d1. The spacing(s) between the first portions 202' of the magnetic junctions is also substantially the same as for the hard mask 204. Thus, the free layers of the magnetic junctions being formed have a lateral dimension, d1 that is less than twenty nanometers and in some embodiments not more than fifteen nanometers. The free layers of the magnetic junctions being formed also have a center-to-center spacing of not more than fifty nanometers and, in some embodiments, not more than forty nanometers.

Step 106 may also include removing the mask 204. In some embodiments, this is accomplished using an oxygen RIE. During this RIE, the underlying adhesion layer, if any, may be oxidized and/or removed. If an Mg, MgTi and/or MgAl adhesion layer is used, then the MgO, MgTiO and/or MgAlO formed as part of the removal process may be some or all of the tunneling barrier layer for the magnetic junctions. Thus, such a portion of the tunneling barrier layer would be self-aligned with the free layer in the first part 202' of the magnetic junctions. A refill step may also be performed. Thus, the regions from which the first portion of the stack 202 have been removed may be insulated.

A second portion of the stack for the magnetic junctions is provided, via step 108. Step 108 may include full film depositing the layers for the second portion of the stack. In such embodiments, additional processing may be required to complete the magnetic junctions. Alternatively, a mask may be provided, the layers deposited and the mask removed. Thus, in some embodiments, this step completes defining the edges of the magnetic junctions. In other embodiments, additional processes are carried out to define the magnetic junctions.

Step 108 includes providing at least the magnetic layer(s) for the pinned layer. In some embodiments, the pinned layer is a multilayer. For example, the pinned layer may be a synthetic antiferromagnet (SAF) including multiple ferromagnetic layers interleaved with and sandwiching nonmagnetic layer(s). In other embodiments, other multilayer(s) may be used in the pinned layer. In addition, if the nonmagnetic spacer layer (e.g. tunneling barrier layer) is not completely formed in steps 102, 104 and 106, then the layer may be provided in step 108. In some embodiments, a portion of the nonmagnetic spacer layer is provided in steps 102-106, while another portion is provided in step 108. Alternatively, all of the nonmagnetic spacer layer may be provided in step 108. In still other embodiments, the nonmagnetic spacer layer may be completed in steps 102, 104 and 106.

Figure 4:
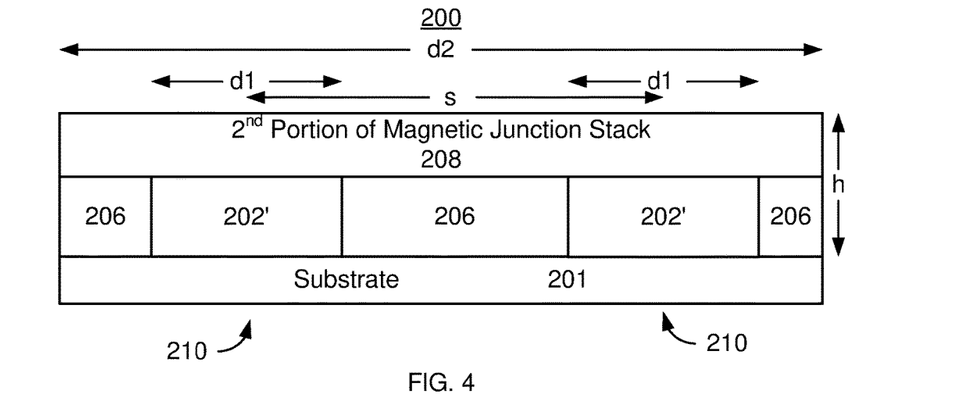

FIG. 4 depicts the magnetic device 200 after step 108 is performed. Thus, the refill 206 and the second portion of the stack 208 have been provided. The refill 206 may be an insulator such as SiN. In the embodiment shown in FIG. 4, the magnetic junctions 210 are completed. Also in this embodiment, the second portion of the stack 208 extends over more than two magnetic junctions 210. For example, the stack 208 may be a line extending over two, four, eight or another number of magnetic junctions 210. The stack 208 may also extend over multiple magnetic junctions (not shown) that are into the plane of the page or out of the plane of the page from the magnetic junctions 210 shown in FIG. 4. Thus, the lateral dimension, d2, of the second portion of the stack 208 may be significantly larger than the lateral dimension of the first portion 202' of the magnetic junctions 210 (d2>>d1). The second portion 208 of the stack includes the pinned layer, while the free layer is in the first portion 202 of the magnetic junctions 210. Thus, the lateral dimension of the pinned layer exceeds that of the free layer. The total height, h, of the magnetic junctions 210 includes the height of the first portion 202' of the magnetic junctions 210 and the height of the second portion of the stack 208.

In some embodiments, an additional mask is provided, via step 110. This additional mask may be a hard mask or other mask. This additional mask is provided on the second portion of the stack 208. The additional mask covers part of the second portion of the stack 208 corresponding to a smaller number of the magnetic junctions. The mask is thus aligned with one or more of the first portions 202' of the magnetic junctions 210. The additional mask also includes aperture(s) that expose another part of the second portion of the stack 208. This part of the second portion of the stack 208 corresponds to the spacing between the pinned layers.

The exposed part of the second portion of the stack 208 is removed, via step 112. Step 112 may be performed using IBE(s), RIE(s), a combination of IBE(s) and RIE(s) and/or some other removal method.

Figure 5:
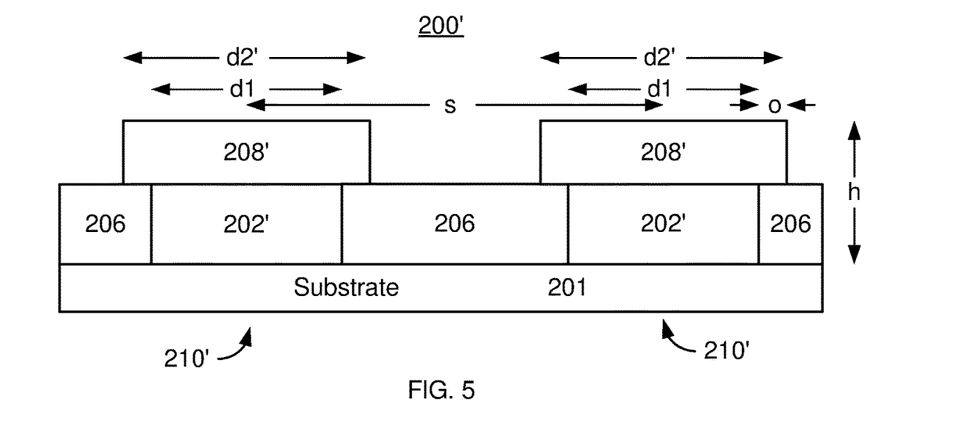

FIG. 5 depicts the magnetic device 200' after step 112 is performed. Thus, the magnetic junctions 210' have been formed. Each magnetic junction 210' includes a first portion 202' and a second portion 208'. The second portion has a lateral dimension, d2, that is not smaller than the lateral dimension of the first portion (d2≥d1). In some embodiments, the second lateral dimension is at least five percent larger than the first lateral dimension. For example, the second lateral dimension may be eight through ten percent larger than the first lateral dimension. Consequently, there may be an overhang, o, for the magnetic junctions 210'. In other embodiments, the overhang may be zero. As discussed above, the pinned layer is in the second portion 208' of the magnetic junctions 210'. Thus, the pinned layer may extend further in the lateral direction(s) than the free layer. Although FIG. 5 indicates that the second portion 208' of the magnetic junctions 210' extend only over a single magnetic junction, in other embodiments, the second portion 208' may extend over multiple magnetic junctions. The total height, h, of the magnetic junctions 210' includes the height of the first portion 202' of the magnetic junctions 210' and the height of the second portion 208' of the magnetic junctions 210'.

Thus, the magnetic device 200/200' may be formed using the method 100. The stack for the magnetic junctions 210/210' is broken into two portions 202/202' and 208/208'. The total height, h, of the magnetic junctions 210/210' may be on the order of five through ten nanometers or more. However, the height of the first portion of the stack 202 is significantly less. The free layer resides in the portion 202' that is closer to the substrate 201. This portion 202' of the magnetic junctions 210/210' may thus be defined to have smaller lateral dimensions and be at a relatively small spacing. The free layers of the magnetic junctions 210/210' may, therefore, be spaced closer together. In some embodiments, the barrier layer may also be self-aligned with the free layer. The use of the refill 206 may aid in ensuring that there is no electrical shunting across the nonmagnetic spacer layer and may mitigate damage that could otherwise be done to the free layer. The desired profile for the magnetic junctions 210/210' may be achieved at lower lateral dimensions and spacing. The shift field at the free layer, the magnetoresistance and other magnetic characteristics of the magnetic junctions 210/210' may also be better controlled in such higher density magnetic devices. Formation of higher density magnetic devices 200/200' may, therefore, be facilitated.

Figure 6:
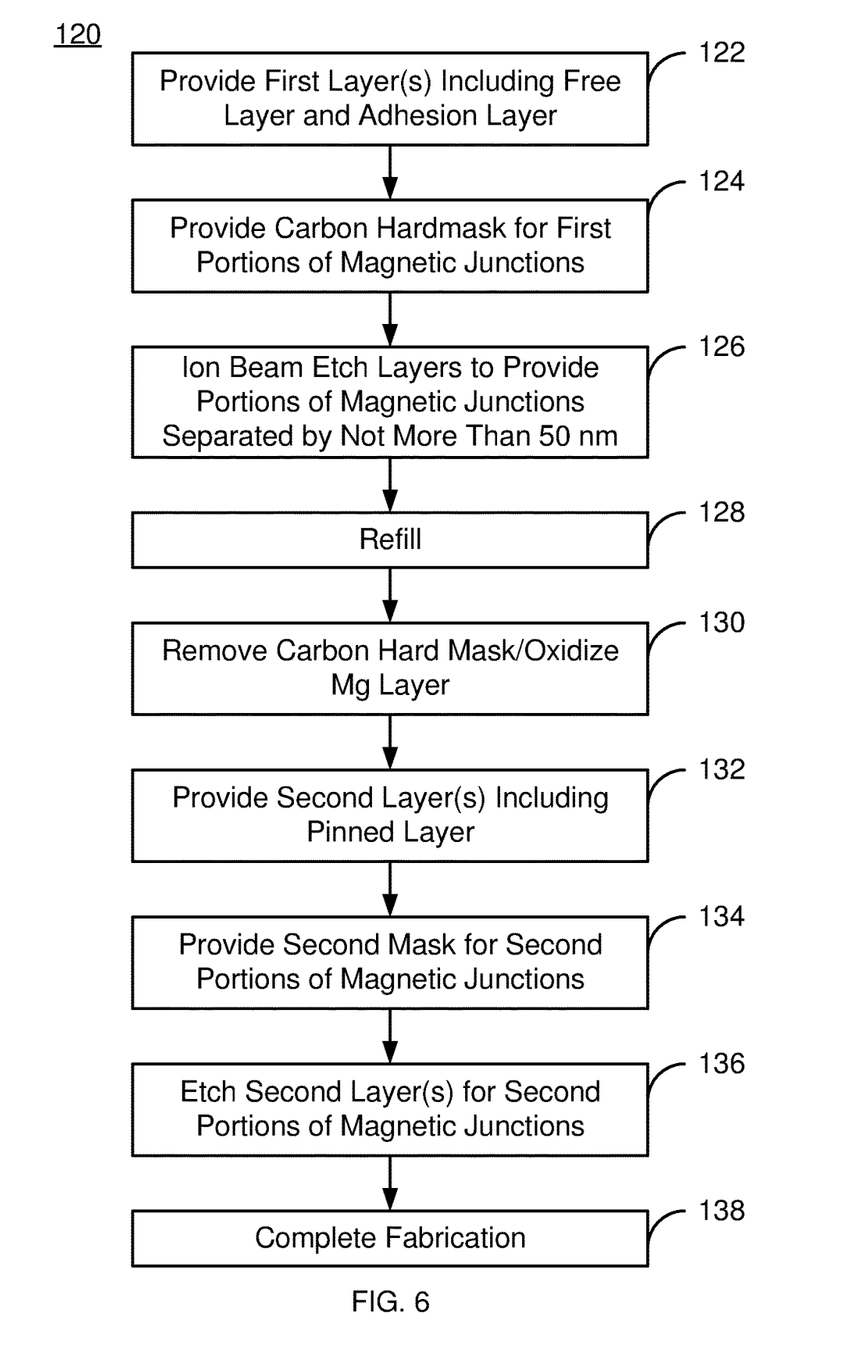
FIG. 6 is a flow chart depicting another exemplary embodiment of a method that utilizes multiple etches for providing magnetic junctions usable in a magnetic devices such as a magnetic memory programmable using spin transfer torque.

FIG. 6 is a flow chart depicting an exemplary embodiment of a method 120 that uses multiple etches for providing magnetic junctions usable in a magnetic devices such as a STT-MRAM and, therefore, in a variety of electronic devices. For simplicity, some steps may be omitted, performed in another order, include substeps and/or combined. Further, the method 120 may start after other steps in forming a magnetic memory have been performed. FIGS. 7-15 depict exemplary embodiments of magnetic devices 250, 250', 250", 250''' and 250'''' that may be fabricated using the method 120. FIGS. 7-15 are not to scale and only a portion of the magnetic devices 250, 250', 250", 250''' and 250'''' are shown. Referring to FIGS. 7-15, the method 120 is described in the context of the magnetic devices 250, 250', 250", 250''' and 250''''. However, other magnetic junctions and/or other devices may be formed. In addition, the components shown may include subcomponents. For example, some polarization enhancement layers (PELs), sublayers in a multilayer and analogous structures are not shown for simplicity. Further, multiple magnetic devices may be simultaneously fabricated.

A first portion of a stack for the magnetic junctions including the free layer is provided, via step 122. Step 122 is thus analogous to step 102. Seed layer(s) may also be provided. If the magnetic junctions being formed are dual magnetic junctions, then the layers for the bottom pinned layer and bottom nonmagnetic spacer layer are also provided in step 122. In some embodiments, step 122 also includes providing at least part of the layers for the nonmagnetic spacer layer. However, the upper portion of the stack is not provided in step 122. Thus, at least one pinned layer for the magnetic junctions being formed is not part of the stack deposited in step 122. Step 122 may also include providing an adhesion layer for the hard mask. Such an adhesion layer may include at least one of Mg, Ti and Ta. In some embodiments, the adhesion layer may become part of the magnetic junction.

A carbon hard mask is provided on the first portion of the stack, via step 124. Step 124 may include depositing a carbon hard mask layer, forming a photoresist mask on the hard mask and then patterning the hard mask layer. The resulting carbon hard mask covers the part of the first portion of the stack corresponding to the magnetic junctions being formed and exposes another part of the first portion of the stack corresponding to the spacing(s) between the magnetic junctions. The Mg adhesion/nonmagnetic spacer layer may also be used as an etch stop layer for formation of the carbon hard mask.

Figure 7:
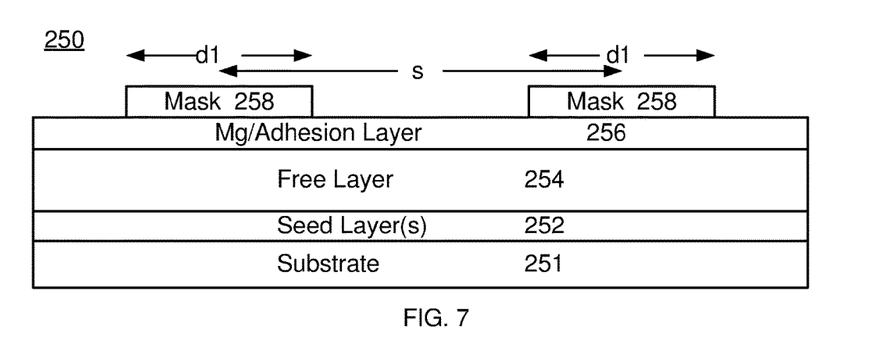
FIGS. 7-11 depict an exemplary embodiment of a magnetic devices such as a magnetic memory programmable using spin transfer torque during fabrication using multiple etches.

FIG. 7 depicts the magnetic device 250 after step 124 is completed. Thus, a substrate 251 is shown. The substrate 251 may include various structures fabricated prior to the magnetic junctions. Seed layer(s) 252, a free layer 254 and Mg/adhesion layer 256 are shown. The free layer 254 may include multiple magnetic and nonmagnetic layers. The Mg/adhesion layer 256 may form at least part of the magnetic junction, as described below. Also shown in the carbon hard mask 258 is also shown. The hard mask 258 covers regions of the layers 252 and 254 from which the magnetic junctions are to be formed. Thus, the lateral dimensions, d1, of at least part of the magnetic junctions and the spacing, s, between the magnetic junctions are shown. The spacing, s, is not more than fifty nanometers. In some embodiments, the spacing is not more than forty nanometers. In some cases, the spacing may be even smaller. The lateral dimension d1 does not exceed twenty nanometers in some embodiments. In some embodiments, the lateral dimension does not exceed fifteen nanometers. In other embodiments, the lateral dimension may differ.

Figure 8:
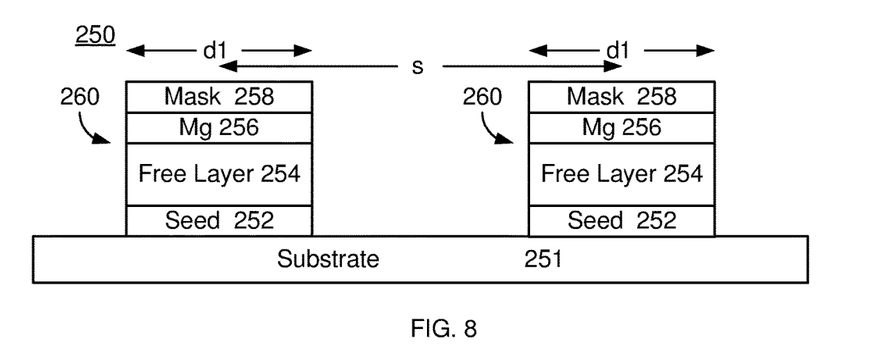

The layers 252, 254 and 256 are etched with the carbon hard mask 258 in place, via step 126. Step 106 may include performing an IBE. In other embodiments, another etch in addition to or in lieu of the IBE may be used. FIG. 8 depicts the magnetic device 250 after the layers 252, 254 and 256 have been etched. Thus, the dimensions, d1, and spacing s of the first portion of the magnetic junction 260 have been defined. The dimensions d1 and spacing s are analogous to those described above.

An insulating refill is also provided, via step 128. Step 128 may include encapsulating the device 250 in an insulating layer and performing a planarization, such as a chemical mechanical planarization (CMP). In such an embodiment, the carbon hard mask 258 may act as a stop layer for the CMP. The carbon hard mask 258 may also be removed, via step 130. Step 130 may include performing an oxygen RIE.

Figure 9:
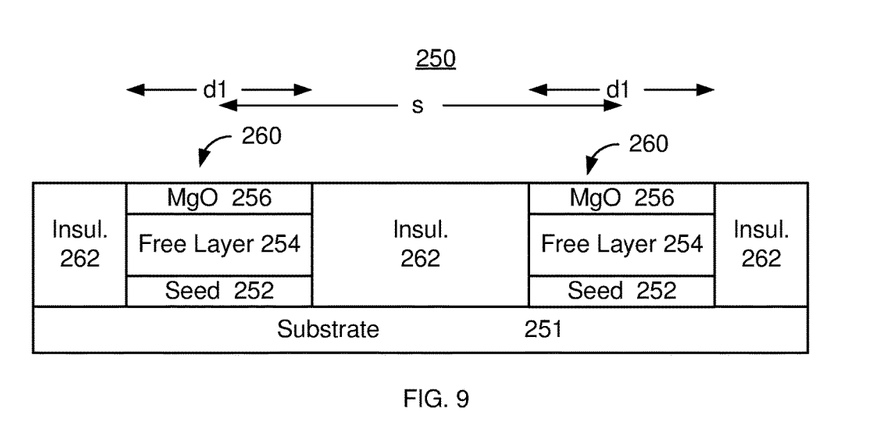

FIG. 9 depicts the magnetic device after step 130 is completed. Thus, the mask 258 has been removed via an oxygen RIE. In addition, the insulator 262 has been provided. In some embodiments, the insulator 262 is SiN. In other embodiments, additional and/or other insulators might be used. Further, the Mg layer 256 has been oxidized. As a result, the layer 256 is now an MgO layer. The tunneling barrier layer for the magnetic junctions being formed may be made in whole or in part of this MgO layer 256.

Figure 10:
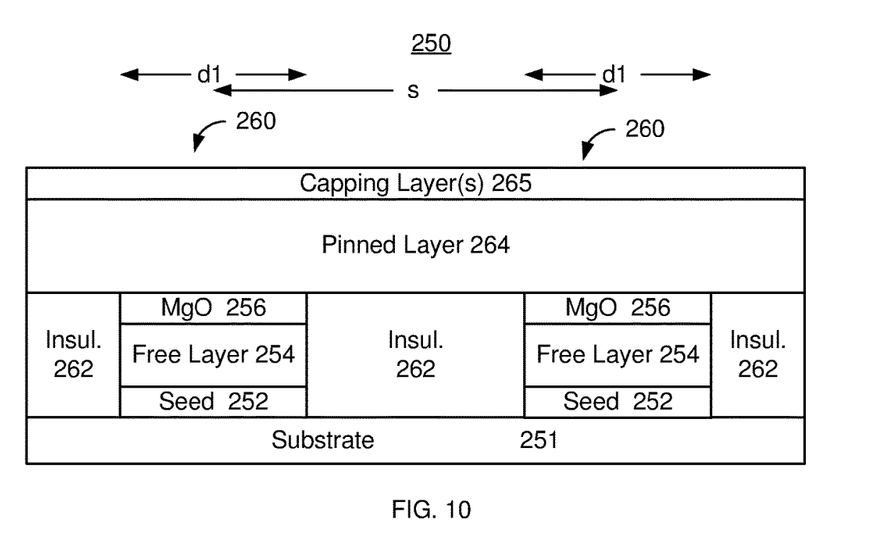

The remaining layers in the stack for the magnetic junctions are provided, via step 132. In some embodiments, step 132 may include full film depositing the remaining layers. FIG. 10 depicts the magnetic device 250 after step 132 is performed. Thus, the pinned layer 264 and capping layer(s) 265 are shown. The pinned layer 264 may be a multilayer. For example, the pinned layer 264 may include a Co/Pt multilayer that has a high perpendicular magnetic anisotropy. Other multilayer(s), materials and/or alloys may also be part of the pinned layer 264. In other embodiments, described below, step 132 may include providing additional layers. For example, a remaining portion of the barrier layer may be deposited. PELs and/or other layers might also be provided.

A second mask for the remaining portion of the magnetic junctions being formed may be provided, via step 134. Step 134 may include providing a hard mask or a photoresist mask. Such a mask also covers the portions of the layers 264 and 265 that are desired to remain and be made part of the magnetic junctions. The mask exposes the portions of the layers 264 and 265 to be removed.

The exposed part of the layers 264 and 265 removed using an etch, via step 136. Step 136 may be performed using IBE(s), RIE(s), a combination of IBE(s) and RIE(s) and/or some other removal method. The remaining portions of the magnetic junctions are thus defined in step 136. Fabrication of the magnetic device may then be completed, via step 138. For example, the remaining layers may be encapsulated with an insulator and electrical contact made to the magnetic junctions.

Figure 11:
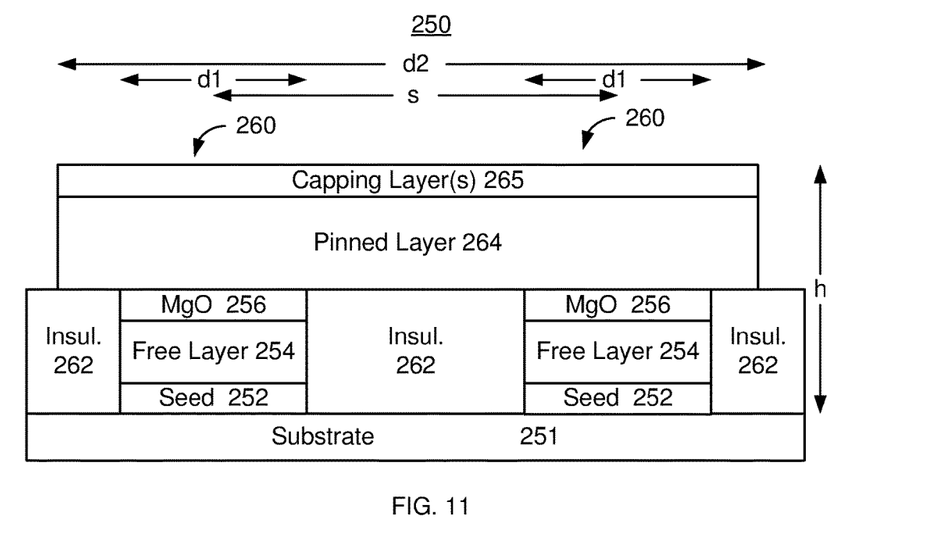

FIG. 11 depicts the magnetic device 250 after step 136 is performed. Thus, the magnetic junctions 260 have been formed. Each magnetic junction 260 includes a first portion including the layers 252, 254 and at least part of 256. Each magnetic junction also includes a second portion having the layers 264 and 265. The second portion has a lateral dimension, d2, that is not smaller than the lateral dimension of the first portion (d2≥d1). In the embodiment shown in FIG. 11, the pinned layer 264 extends over multiple magnetic junctions 260. For such a pinned layer 264, the shift field at the free layer 254 due to the pinned layer 264 may be sufficiently small that a SAF is not used for the pinned layer 264. In other embodiments, a SAF may be used for the pinned layer 264. Further, the total height, h, of the magnetic junctions 260 is larger than that of the layers 252, 254 and 256.

Figure 12:
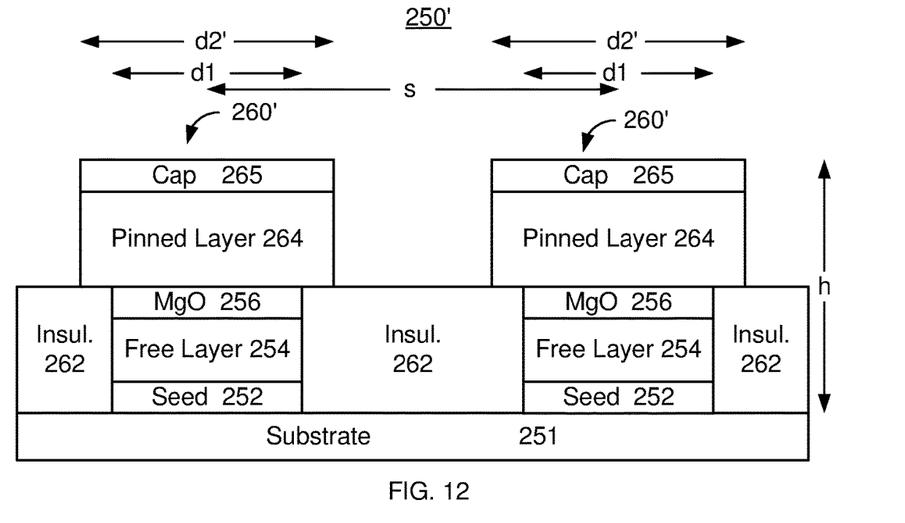
FIG. 12 depicts another exemplary embodiment of a magnetic devices such as a magnetic memory programmable using spin transfer torque and fabricated using multiple etches.

FIG. 12 depicts another embodiment of the magnetic device 250' after step 136 is performed. In this embodiment, the pinned layer 264 is part of a single magnetic junction 260'. The pinned layer 264 has a lateral dimension d2' that is not smaller than the lateral dimension, d1, of the free layer 254. In some embodiments, these lateral dimensions are the same. However, more generally, there is some overhang of the pinned layer 264. For example, the second lateral dimension may at least five percent larger than the first lateral dimension. In some embodiments, the second lateral dimension may be eight through ten percent larger than the first lateral dimension. The total height, h, of the magnetic junctions 260' is still significantly greater than that of the underlying layers of the magnetic junction such as layers 252, 254 and 256.

Figure 13:
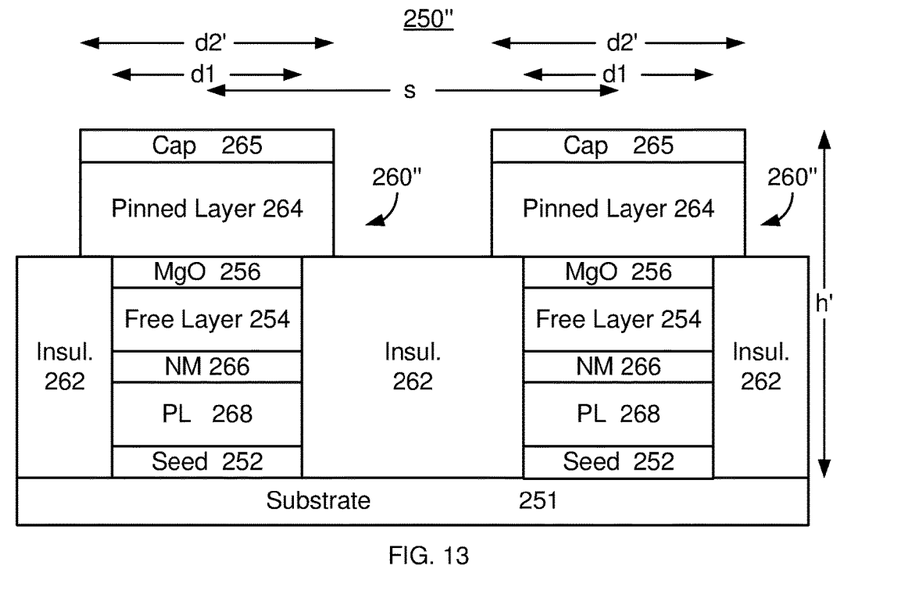
FIG. 13 depicts another exemplary embodiment of a magnetic device such as a magnetic memory programmable using spin transfer torque and fabricated using multiple etches.

FIG. 13 depicts another embodiment of the magnetic device 250" after step 136 is performed. In this embodiment, the magnetic junctions 250" are dual magnetic junctions. Thus, a pinned layer 268 and additional nonmagnetic spacer layer 266 were formed prior to the free layer 254 and MgO 256. The lateral dimensions and height, h', are analogous to those described above. The nonmagnetic spacer layer 266 may be a tunneling barrier layer and is analogous to the MgO 256. However, the thicknesses of the layers 256 and 266 may be desired to be different in order to facilitate reading of the magnetic device 250".

Figure 14:
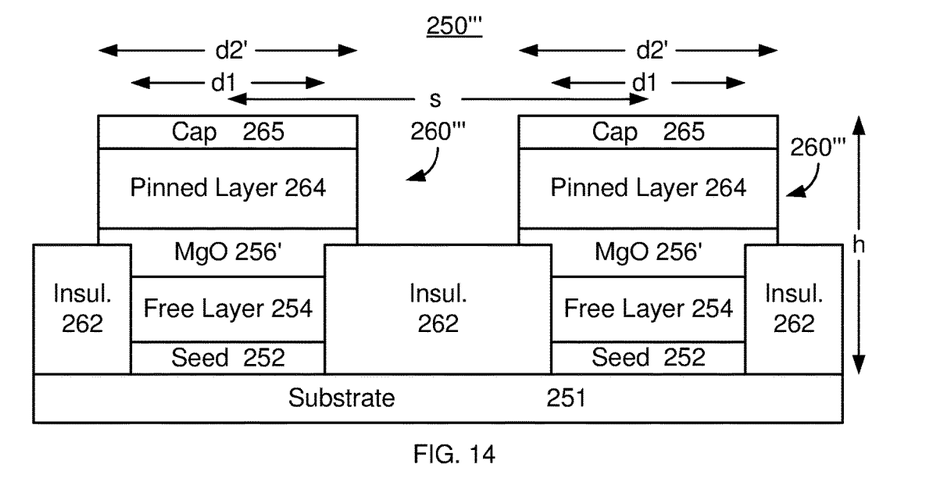
FIG. 14 depicts another exemplary embodiment of a magnetic device such as a magnetic memory programmable using spin transfer torque and fabricated using multiple etches.

FIG. 14 depicts another embodiment of the magnetic device 250''' after step 136 is performed. In this embodiment, a portion of the MgO barrier layer 256' is formed as part of step 132. Thus, a portion of the MgO layer 256' has the lateral dimension d2', while the lower portion of the MgO layer 256' has the lateral dimension d1. The height and remaining lateral dimensions are as described above.

Figure 15:
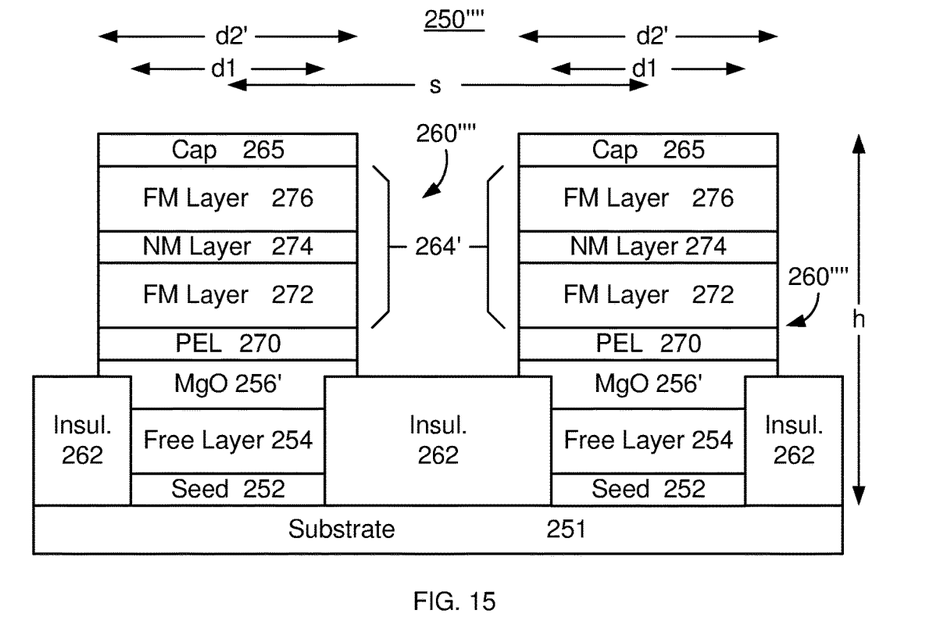
FIG. 15 depicts another exemplary embodiment of a magnetic device such as a magnetic memory programmable using spin transfer torque and fabricated using multiple etches.

FIG. 15 depicts another embodiment of the magnetic device 250'''' after step 136 is performed. In the embodiment shown, the pinned layer 264' deposited as part of step 132 is a SAF. Thus, the pinned layer 264' includes ferromagnetic layers 272 and 276 that are separated by a nonmagnetic coupling layer 274, such as Ru. Also shown is a PEL 270 that was provided in step 132. In addition, a portion of the MgO barrier layer 256' is formed as part of step 132. Thus, a portion of the MgO layer 256' has the lateral dimension d2', while the lower portion of the MgO layer 256' has the lateral dimension d1. The remaining lateral dimensions and height are as described above.

Thus, the magnetic devices 250, 250', 250", 250'" and/or 250"" may be formed using the method 120. The stack for the magnetic junctions 260, 260', 260", 260'" and 260"" is broken into two portions. The free layer 254 is in the first portion while the pinned layer 264/264' is in the second portion. The total height, h, of the magnetic junctions 260, 260', 260", 260'" and 260"" may be on the order of five through ten nanometers or more. However, the height of the first portion of the stack is significantly less. This portion of the magnetic junctions 260, 260', 260", 260'" and 260"" including the free layer 254 may be defined to have smaller lateral dimensions and be at a relatively small spacing. The magnetic junctions 260, 260', 260", 260'" and 260"" may, therefore, be spaced closer together. In some embodiments, at least part of the barrier layer may also be self-aligned with the free layer. The use of the insulator 262 may aid in ensuring that there is no electrical shunting across the MgO layer 256/256' and may mitigate damage that could otherwise be done to the free layer 254. The desired profile for the magnetic junctions 260, 260', 260", 260'" and 260"" may be achieved at lower lateral dimensions and spacing. The shift field at the free layer 254, the magnetoresistance and other magnetic characteristics of the magnetic junctions 260, 260', 260", 260'" and 260"" may also be better controlled in such higher density magnetic devices. Formation of higher density magnetic devices 250, 250', 250", 250'" and/or 250"" may, therefore, be facilitated.

Although the method and apparatus have been described in the context of specific features, steps and components, one of ordinary skill in the art will recognize that one or more of these features, steps and/or components may be combined in other manners not inconsistent with the description herein.

Figure 16:
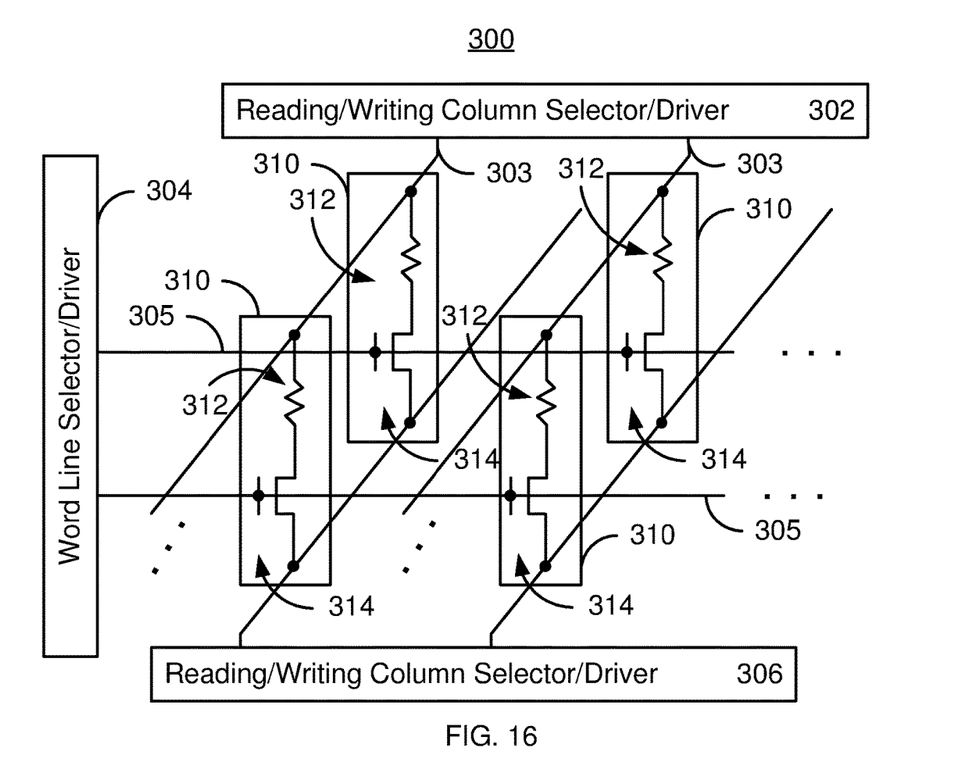
FIG. 16 depicts an exemplary embodiment of a memory utilizing magnetic junctions in the memory element(s) of the storage cell(s).

FIG. 16 depicts an exemplary embodiment of a memory 300 that may use one or more of the magnetic junctions 210, 210', 260, 260', 260", 260'", 260"" and/or other analogous magnetic junction. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 210, 210', 260, 260', 260", 260'", 260"" and/or other analogous magnetic junction. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a plurality of magnetic junctions residing on a substrate, each of the plurality of magnetic junctions including a free layer a pinned layer and a nonmagnetic spacer layer between the free layer and the pinned layer, the method comprising: providing a first portion of a stack for the plurality of magnetic junctions, the first portion of a stack including at least one magnetic layer for the free layer and an adhesion layer; providing a hard mask on the adhesion layer of the first portion of the stack, the hard mask covering a first part of the first portion of the stack corresponding to the plurality of magnetic junctions, the hard mask including at least one aperture exposing a second part of the first portion of the stack corresponding to at least one spacing between the plurality of magnetic junctions, the at least one spacing being not more than fifty nanometers; etching the second part of the first portion of the stack, a remaining part of the first portion of the stack forming a first portion of each of the plurality of magnetic junctions, the first portion of each of the plurality of magnetic junctions including the free layer, the step of etching the second part of the first portion of the stack further includes; performing an ion beam etch;

and removing the hard mask using an oxygen reactive ion etch, the oxygen reactive ion etch further oxidizing the adhesion layer to provide at least a portion of the nonmagnetic spacer layer such that the portion of the nonmagnetic spacer layer is self-aligned with the free layer; providing a second portion of the stack for the plurality of magnetic junctions after the step of etching the second part of the first portion of the stack, the second portion of the stack including a pinned layer.

2. The method of claim 1 further comprising:

providing an additional mask on the second portion of the stack, the additional mask covering a first part of the second portion of the stack corresponding to the plurality of magnetic junctions, the additional mask including at least one additional mask aperture exposing a second part of the second portion of the stack, the first part of the second portion of the stack being on the first portion of each of the plurality of magnetic junctions; and etching the second part of the second portion of the stack, a remaining part of the second portion of the stack forming a second portion of each of the plurality of magnetic junctions.

3. The method of claim 2 wherein the first portion of each of the plurality of magnetic junctions has a first lateral dimension and the second portion of each of the plurality of magnetic junctions has a second lateral dimension, the second lateral dimension being not smaller than the first lateral dimension.

4. The method of claim 3 wherein the second lateral dimension is at least five percent larger than the first lateral dimension.

5. The method of claim 4 wherein the second lateral dimension is greater than the at least one spacing.

6. The method of claim 1 wherein the at least one spacing is not more than forty nanometers.

7. The method of claim 1 wherein the hard mask is a carbon hard mask.

8. The method of claim 1 wherein the first portion of the stack includes an adhesion layer including at least one of Mg, MgTi, MgAl, Ti and Ta and wherein the hard mask resides on the adhesion layer.

9. The method of claim 8 wherein the adhesion layer is an Mg layer, wherein each of the plurality of magnetic junctions includes the pinned layer and a nonmagnetic spacer layer between the pinned layer and the free layer and wherein the nonmagnetic spacer layer includes Mg.

10. A method for providing a plurality of magnetic junctions residing on a substrate, each of the plurality of magnetic junctions including a free layer, the method comprising:
providing a first portion of a stack for the plurality of magnetic junctions, the first portion of a stack including at least one magnetic layer for the free layer and an adhesion layer being an Mg layer;
providing a hard mask on the adhesion layer of the first portion of the stack, the hard mask covering a first part of the first portion of the stack corresponding to the plurality of magnetic junctions, the hard mask including at least one aperture exposing a second part of the first portion of the stack corresponding to at least one spacing between the plurality of magnetic junctions, the at least one spacing being not more than fifty nanometers;
etching the second part of the first portion of the stack, a remaining part of the first portion of the stack forming a first portion of each of the plurality of magnetic junctions, the first portion of each of the plurality of magnetic junctions including the free layer;
providing a second portion of the stack for the plurality of magnetic junctions;
wherein each of the plurality of magnetic junctions includes a pinned layer and a nonmagnetic spacer layer between the pinned layer and the free layer, wherein the nonmagnetic spacer layer includes Mg; and
wherein the step of etching the second portion of the first plurality of layers further includes:
performing an ion beam etch; and
removing the hard mask using an oxygen reactive ion etch, the oxygen reactive ion etch further oxidizing the Mg layer to provide an MgO layer, the MgO layer forming at least a portion of the nonmagnetic spacer layer such that the portion of the nonmagnetic spacer layer is self-aligned with the free layer.

11. The method of claim 1 wherein the second portion of the stack includes at least an additional magnetic layer corresponding to a pinned layer for each of the plurality of magnetic junctions and wherein each of the plurality of magnetic junctions includes a nonmagnetic spacer layer between the free layer and the pinned layer.

12. The method of claim 11 wherein the first portion of each of the plurality of magnetic junctions includes an additional pinned layer and an additional nonmagnetic spacer layer between the free layer and the additional pinned layer.

13. A method for providing a plurality of magnetic junctions, each of the plurality of magnetic junctions including a pinned layer, a free layer and a nonmagnetic tunneling barrier layer between the pinned layer and the free layer, the method comprising:
providing a first plurality of layers for the plurality of magnetic junctions, the first plurality of layers including a magnetic layer for the free layer and an Mg layer on the magnetic layer;
providing a carbon hard mask on the Mg layer, the carbon hard mask covering a first portion of the first plurality of layers corresponding to the plurality of magnetic junctions, the carbon hard mask including at least one aperture exposing a second portion of the first plurality of layers corresponding to at least one spacing between the plurality of magnetic junctions, the at least one spacing being not more than fifty nanometers;
ion beam etching the second portion of the first plurality of layers, a remaining portion of the first plurality of layers forming a first portion of each of the plurality of magnetic junctions, the first portion including the free layer, the free layer for each the plurality of magnetic junctions being at the at least one spacing;
providing an insulating refill between the first portion of each of the plurality of magnetic junctions;
removing the carbon hard mask using an oxygen reactive ion etch, the oxygen reactive ion etch oxidizing the Mg layer to provide an MgO layer, the MgO layer forming at least a portion of the nonmagnetic tunneling barrier layer such that the portion of the nonmagnetic tunneling barrier layer is self-aligned with the free layer;
providing a second plurality of layers forming a second portion of the stack for the plurality of magnetic junctions, the second plurality of layers including an additional magnetic layer for a pinned layer for each of the plurality of magnetic junctions.

14. The method of claim 13 further comprising:
providing an additional mask on the second plurality of layers, the additional mask covering a first portion of the second plurality of layers corresponding to the plurality of magnetic junctions, the second mask including at least one second mask aperture exposing a second portion of the second plurality of layers, the first portion of the second plurality of layers covering the remaining portion of the first plurality of layers; and
ion beam etching the second portion of the second plurality of layers, a remaining portion of the second plurality of layers forming a second portion of each of the plurality of magnetic junctions, the second portion including the pinned layer.

* * * * *